US008283946B2

(12) United States Patent
Lee

(10) Patent No.: US 8,283,946 B2
(45) Date of Patent: Oct. 9, 2012

(54) SIGNALING SYSTEMS, PREAMPLIFIERS, MEMORY DEVICES AND METHODS

(75) Inventor: Seong-Hoon Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 139 days.

(21) Appl. No.: 12/760,922

(22) Filed: Apr. 15, 2010

(65) Prior Publication Data

US 2011/0254627 A1   Oct. 20, 2011

(51) Int. Cl.
*H03K 19/0175* (2006.01)
(52) U.S. Cl. ............... 326/81; 326/83; 326/86; 326/21; 326/30
(58) Field of Classification Search ............ 326/63, 326/68, 80, 81, 83, 86, 30, 21; 365/189.05, 365/189.09, 207
See application file for complete search history.

(56) References Cited

U.S. PATENT DOCUMENTS

| | | | | |
|---|---|---|---|---|
| 6,826,390 B1* | 11/2004 | Tamura | ............ | 455/226.1 |
| 6,934,197 B2* | 8/2005 | Han | ............ | 365/189.05 |
| 7,292,629 B2* | 11/2007 | Zerbe et al. | ............ | 375/229 |
| 7,459,938 B2* | 12/2008 | To et al. | ............ | 326/83 |
| 7,698,470 B2* | 4/2010 | Ruckerbauer et al. | ............ | 710/14 |
| 2006/0062039 A1 | 3/2006 | Ruckerbauer et al. | | |
| 2006/0215787 A1 | 9/2006 | Wu et al. | | |
| 2007/0165472 A1 | 7/2007 | Zerbe et al. | | |
| 2008/0068043 A1* | 3/2008 | Chiu | ............ | 326/68 |
| 2009/0072860 A1* | 3/2009 | Lee | ............ | 326/83 |
| 2009/0247088 A1 | 10/2009 | Hollis | ............ | 455/68 |
| 2009/0261859 A1 | 10/2009 | Hollis et al. | ............ | 326/63 |
| 2010/0060320 A1* | 3/2010 | Lee | ............ | 326/80 |

OTHER PUBLICATIONS

International Search Report and Written Opinion in International Application No. PCT/US2011/031119 dated Nov. 1, 2011.

* cited by examiner

*Primary Examiner* — Vibol Tan
(74) *Attorney, Agent, or Firm* — Dorsey & Whitney LLP

(57) ABSTRACT

Signaling systems, preamplifiers, memory devices and methods are disclosed, such as a signaling system that includes a transmitter configured to receive a first digital signal. The transmitter provides a transmitted signal corresponding to the digital signal to a signal path. A receiver system coupled to the signal line includes a preamplifier coupled to receive the transmitted signal from the signal path. The preamplifier includes a common-gate amplifying transistor that is configured to provide an amplified signal. The receiver system also includes a receiver coupled to receive the amplified signal from the preamplifier. The receiver is configured to provide a second digital signal corresponding to the amplified signal received by the receiver. Such a signaling system may be used in a memory device or in any other electronic circuit.

21 Claims, 4 Drawing Sheets

SIGNALING SYSTEMS, PREAMPLIFIERS, MEMORY DEVICES AND METHODS

TECHNICAL FIELD

Embodiments of this invention relate to circuitry for transmitting and/or receiving signals, and, more particularly, to circuitry for transmitting and receiving signals while consuming relatively little power.

BACKGROUND OF THE INVENTION

Many of today's electronic systems are portable and provide users with mobility and ease of transport. Laptops, cellular phones, digital cameras, portable gaming systems, handheld GPS receivers, are just a few examples of portable electronic systems. These systems generally have become increasingly lighter and smaller in form factor, while at the same time, however, these systems may have ever greater performance than their predecessors. The increased performance typically has come at the expense of greater power consumption. Since these systems rely on battery power, system designers make an effort to design systems for low power consumption so that the systems can be operated for a greater length of time before replacing or recharging the battery.

As part of the effort to design lower power electronic systems, system designers often design electronic systems to utilize components and circuitry that operate with lower power consumption. For example, since many of today's systems include memory devices for storing data that are used during operation, using lower power memory devices may result in a significant reduction in the overall power consumed by such systems. However, since greater memory capacity or performance may come at the cost of additional power consumption, there may be a tradeoff between operating at lower power while maintaining or improving performance.

Significant power may also be consumed by electronic systems in coupling signals within individual components and between different components since substantial power may be consumed in signal lines through which signals are coupled. Significant power may also be consumed in transmitting and receiving circuits for the signals. In general, the amount of power consumed is somewhat proportional to the magnitude of the signals being transmitted and received. Thus, reducing the magnitude of the signals being coupled may reduce the amount of power consumed. However, reducing the magnitude of signals transmitted and received within a component and between components can result in a variety of other problems. Thus, there may be a practical limit in the degree to which power in electronic systems may be reduced, although improvements continue to reduce the value of this practical limit.

DETAILED DESCRIPTION

Figure 1:
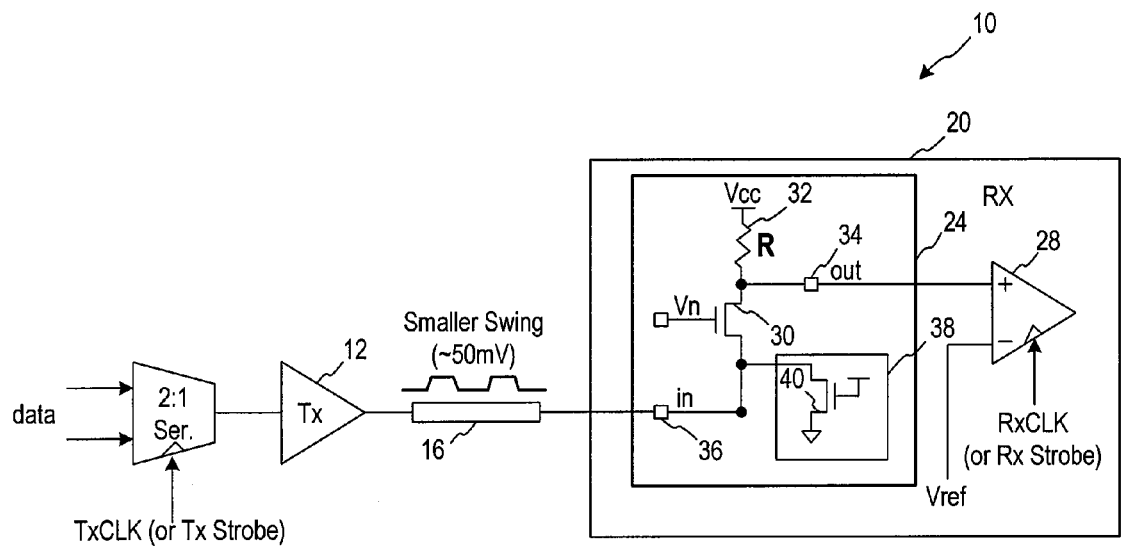
FIG. 1 is a schematic diagram of a signaling system according to one embodiment.

A signaling system 10 according to one embodiment is shown in FIG. 1. The signaling system 10 may include a transmitter 12 coupled to a signal path, such as line 16, which may be unterminated by any impedance matching device. Unterminated lines where impedance matching may not be required may be relatively short, such as on-chip interconnects and chip-to-chip interconnects like through silicon vias. The transmitter 12 may receive a digital signal from any digital circuit, such as a serializer (not shown), which may perform the function of converting parallel data into a corresponding serial data stream. The transmitter 12 may then apply to the signal line 16 at an output node a transmitted signal corresponding to the digital signal. As mentioned above, the amount of power consumed by coupling signals from one location to another may be a function of the magnitude of the signals being coupled. The transmitter 12 may be designed to minimize power consumption by generating a signal having a relatively small magnitude. In one embodiment, the peak-to-peak amplitude of the signal transmitted by the transmitter 12 may be about 50 millivolts, although the amplitude of the signal may be greater or less than 50 my in other embodiments.

The relatively small magnitude of the signal transmitted by the transmitter 12 may make it difficult to properly receive the transmitted signal at a location to which the signal is transmitted. Accordingly, a receiver system 20 coupled to the signal line 16 may include a preamplifier 24 for amplifying the transmitted signal before it is applied to a receiver 28. Although the preamplifier 24 may consume power, the amount of extra power consumed by the preamplifier 24 can be more than made up for by the reduction in power consumed by coupling a signal having a relatively small amplitude from the transmitter 12 to the receiver system 20. The preamplifier 24 may be an amplifier that has a first input node coupled to receive the transmitted signal from the signal line 16 and a second input node coupled to receive a bias voltage Vn. In operation, the preamplifier 24 may output at an output node an amplified signal corresponding to the transmitted signal received by the preamplifier 24 from the signal line 16. The amplitude of the signal amplified by the preamplifier 24 may be greatly affected by the amplitude of the bias voltage Vn. Optimal magnitude of the bias voltage may depend on the characteristics of the circuitry in the preamplifier 24. The preamplifier 24 may be configured so that the signal swing of the amplified signal is substantially equal to that of the transmitted signal received by the preamplifier 24. However, the gain of the preamplifier may be greater than unity or less than unity so that the signal swing of the signal amplified by the preamplifier 24 is grater or lesser, respectively, than the signal swing of the transmitted signal received by the preamplifier 24.

In the embodiment of the signaling system 10 shown in FIG. 1, the preamplifier 24 may be implemented with a common-gate amplifying transistor, such as an NMOS transistor 30, having a gate to which the bias voltage Vn is applied. A drain of the transistor 30 may be coupled to a supply voltage, such as Vcc, through a load impedance, such as resistance 32. An output node 34 may be provided at a junction between the resistance 32 and the drain of the transistor 30, and it may be coupled to the input of the receiver 28. A source of the transistor 30 may be coupled to an input node 36 and to a bleeder impedance 38, such as a drain of a second transistor, such as an NMOS transistor 40. The input node 36 may be coupled to receive the transmitted signal from the line 16. The transistor 40 may have its gate coupled to receive a bias voltage, such as the supply voltage Vcc, and its source coupled to a second supply voltage, such as ground. The supply voltage Vcc coupled to the gate of the transistor 40, in combination with the electrical characteristics of the transistor 40, sets the magnitude of the bleeder impedance at a suitable value. However, in other embodiments, a bias voltage other than Vcc may be applied to the gate of the transistor 40. The transistor 40, functioning as a bleeder impedance, may reduce internal signal interference, which may degrade the output signal applied to the output node 34. The bleeder impedance may also reduce the magnitude of current injected into the input node 36.

The receiver 28 may have a first input node coupled to receive the amplified signal from the output node 34 of the preamplifier 24, and a second input node coupled to receive a reference voltage Vref. The receiver 28 may be configured to provide (e.g., apply, supply, output, etc.) at an output node a digital signal corresponding to the amplified signal received from the preamplifier 24.

Figure 2:
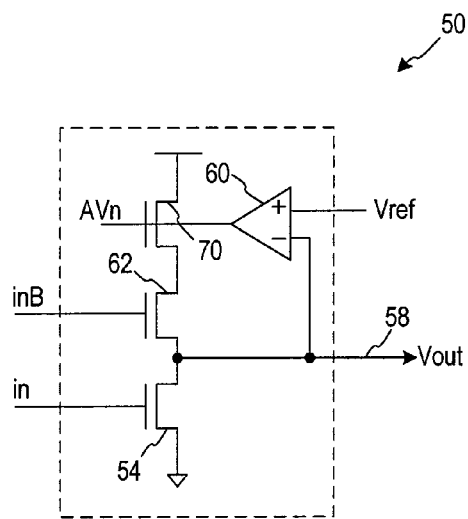
FIG. 2 is a schematic diagram of a signal driver circuit according to one embodiment that may be used in the signaling system of FIG. 1 or in some other signaling system embodiment.

FIG. 2 illustrates an embodiment of a transmitter 50, which may be used as the transmitter 12 shown in FIG. 1 or some other signaling system embodiment. The transmitter 50 includes a first transistor 54 having a drain coupled to an output node 58 and a source coupled to a reference node, such as ground. The transmitter 50 further includes a second transistor 62 having a source coupled to the output node 58. An input signal "in" may be applied to a gate of the first transistor 54 and a complementary input signal "inB" may be applied to a gate of the second transistor 62. Conventional circuitry and techniques known to those ordinarily skilled in the art can be used to generate the complementary input signal inB. The transistor 54 acts as a pull-down transistor to pull the output node 58 down to the reference node (e.g., ground) when activated, and the transistor 62 acts as a pull-up transistor to pull up the output node 58 to a VHigh voltage when activated. The transistors 54 and 62 function as switches to couple and decouple the output node 58 according to the in and inB signals. An output signal Vout may be provided at the output node 58 having a logic level in accordance with the logic level of the in (and inB) signal. A third transistor 70 may be coupled to a supply voltage, such as Vcc, and the drain of the second transistor 62. A gate of the transistor 70 may be coupled to the output of a voltage comparator circuit 60 having a first input coupled to the output node 58 and a second input coupled to receive a voltage reference signal Vref. The transistor 70 may be controlled by a control voltage AVn generated by the voltage comparator circuit 60 in response to a comparison of the Vout voltage and a reference voltage Vref. In the embodiment of the invention illustrated in FIG. 2, the transistors 54, 62, 70 are n-channel transistors, for example, n-channel metal-oxide semiconductor ("NMOS") transistors. In other embodiments, the transistors 54, 62, 70 can be other types of transistors as well.

Figure 3:
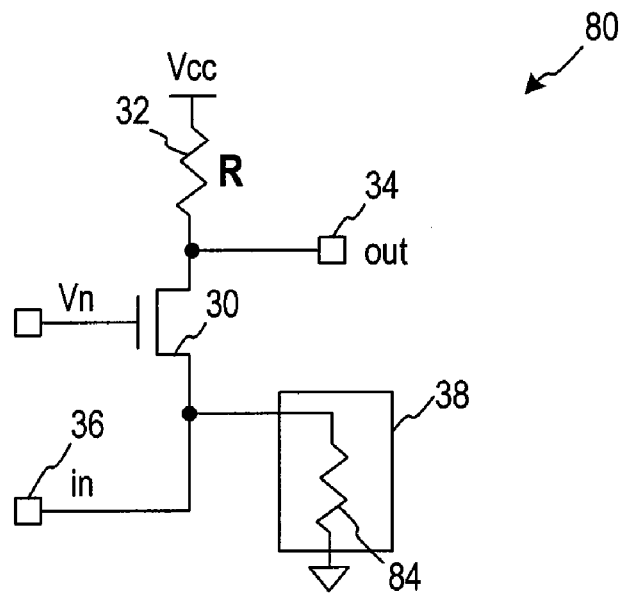
FIG. 3 is a schematic diagram of a preamplifier according to another embodiment that may be used in the signaling system of FIG. 1 or in some other signaling system embodiment.

Another embodiment of a preamplifier 80 that may be used instead of the preamplifier 24 shown in FIG. 1 is shown in FIG. 3. The preamplifier 80 uses most of the same components used in the preamplifier 24. Therefore, in the interest of brevity and clarity, an explanation of the characteristics and operation of these common components will not be repeated. The preamplifier 80 differs from the preamplifier 24 shown in FIG. 1 by using a resistor 84 instead of the transistor 40 as the bleeder impedance 38. In all other respects, the preamplifier 80 may be the same as the preamplifier 24 shown in FIG. 1.

Figure 4:
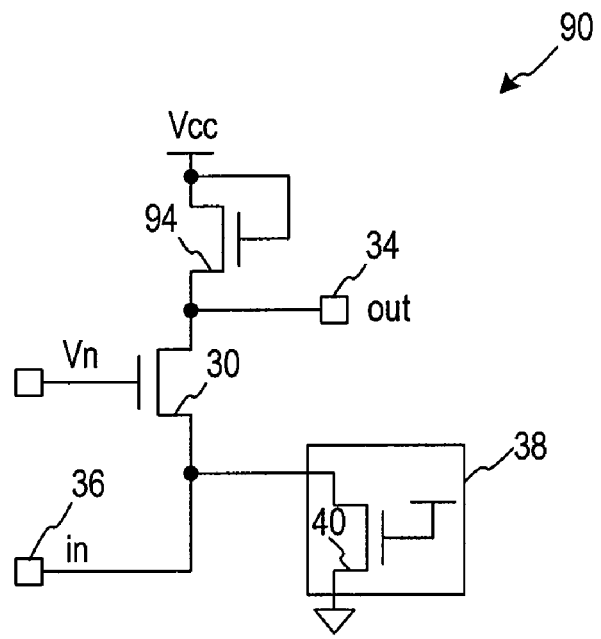
FIG. 4 is a schematic diagram of a preamplifier according to another embodiment that may be used in the signaling system of FIG. 1 or in some other signaling system embodiment.

Another embodiment of a preamplifier 90 that may be used instead of the preamplifier 24 shown in FIG. 1 is shown in FIG. 4. Again, the preamplifier 90 uses most of the same components used in the preamplifier 24 so that the characteristics and operation of these common components will not be repeated. The preamplifier 90 differs from the preamplifier 24 shown in FIG. 1 by using a transistor 94 as a load impedance instead of the resistor 32 used as the load impedance in the preamplifier 24 of FIG. 1. The transistor 94 has its gate coupled to a bias voltage, such as the supply voltage Vcc, to set the magnitude of the load impedance to a suitable value. However, in other embodiments, a voltage other than Vcc may be applied to the gate of the transistor 94.

Figure 5:
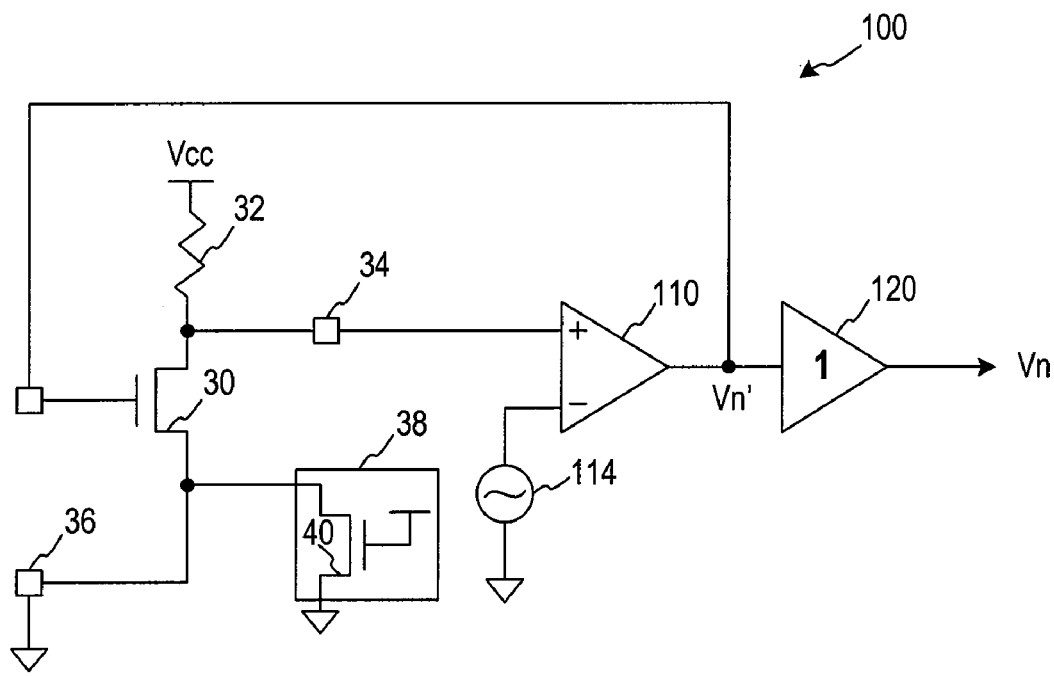
FIG. 5 is a schematic diagram of a bias voltage circuit that may be used to supply a bias voltage to the preamplifier embodiments shown in FIGS. 1, 3 and 4 or a preamplifier according to some other embodiment.

FIG. 5 is a schematic diagram of a bias voltage circuit 100 that may be used to supply the bias voltage Vn to the preamplifier embodiments shown in FIGS. 1, 3 and 4 or a preamplifier according to some other embodiment. The bias voltage circuit 100 includes a circuit that may be essentially identical to the preamplifier 24 shown in FIG. 1 except that the source of the transistor 30 is coupled to a reference voltage, such as ground, rather than to an input node 36 (FIG. 1). Therefore, the characteristics of the bias voltage circuit 100 may vary with process, supply voltage and/or temperature in the same manner that the characteristics of the preamplifier 24 vary.

The output node 34 may be coupled to a first input of a differential amplifier 110, which may be a circuit that is essentially the same as the receiver 28 used in the signaling system 10 of FIG. 1. A second input to the differential receiver 110 may be coupled to a reference voltage source 114, which may supply a reference voltage having a particular magnitude. In one embodiment, the reference voltage may have a magnitude that is equal to about 20% of the magnitude of the supply voltage Vcc. Finally, an output of the differential amplifier 110 generates a voltage Vn' that may be coupled to the gate of the transistor 30, and, in the embodiment of FIG. 5, to a buffer 120 having a particular gain, such as a unity gain. However, in other embodiments, the buffer 120 may not be used, and the bias voltage Vn may be provided at the output of the differential amplifier 110.

In operation, the voltage Vn' may apply a voltage to the gate of the transistor 30 that sets the magnitude of the voltage applied to the first input of the differential amplifier 110 through the node 34. If this voltage is greater than the voltage from the reference voltage source 114, the voltage Vn' is increased, thereby increasing the current flowing through the transistor 30. As a result, the voltage applied to the node 34 is decreased toward the voltage from the reference voltage source 114. If the voltage applied to the node 34 is less than the voltage from the reference voltage source 114, the circuit 100 operates in the opposite manner to increase the voltage applied to the node 34 toward the voltage from the reference voltage source 114. The loop gain through the transistor 30 and the differential amplifier 110 may be sufficiently high that the voltage applied to the node 34 is substantially equal to the voltage provided by the reference voltage source 114. The bias voltage Vn provided to the preamplifier embodiments of FIGS. 1, 3 and 4 may thus be set at the voltage provided by the reference voltage source 114.

Figure 6:
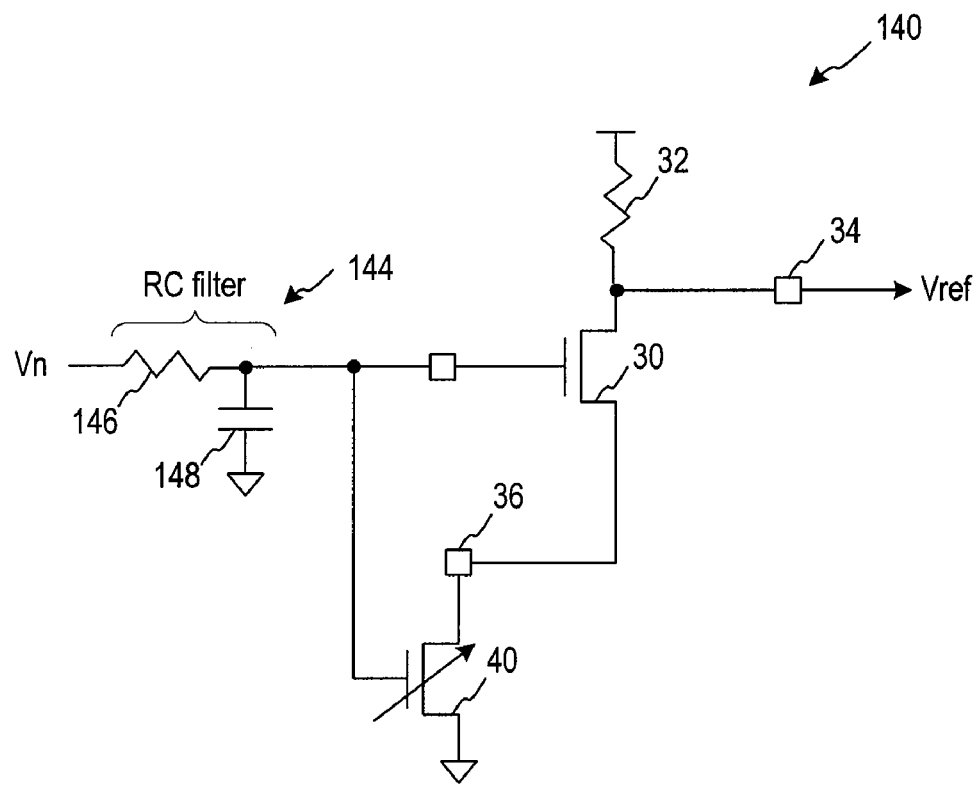
FIG. 6 is a schematic diagram of a reference voltage circuit that may be used to supply a reference voltage to the receiver in the signaling circuit embodiment shown in FIG. 1 or a receiver in a signaling circuit according to some other embodiment.

A reference voltage generator 140 that may be used to supply the reference voltage Vref to the receiver 28 (FIG. 1) is shown in FIG. 6. The reference voltage generator 140 may also be similar to the preamplifier 24 shown in FIG. 1, and thus may also have characteristics that closely track variations in the characteristics of the preamplifier 24 resulting from process, supply voltage and/or temperature changes. However, rather than coupling the gate of the transistor 40 to Vcc as in the preamplifier 24 shown in FIG. 1, the gate of the transistor 40 may be coupled to the gate of the transistor 30, and thus also receives the bias voltage Vn. Further, the bias voltage Vn may be applied to the gate of the transistor 30 through a low-pass filter 144 including a resistance 146 and a capacitance 148 of suitable values to select a frequency at which noise in the bias voltage Vn is attenuated. Additionally, the transistor 40 may be tunable to vary the impedance characteristics of the transistor 40 and thus the magnitude of the reference voltage Vref.

Figure 7:
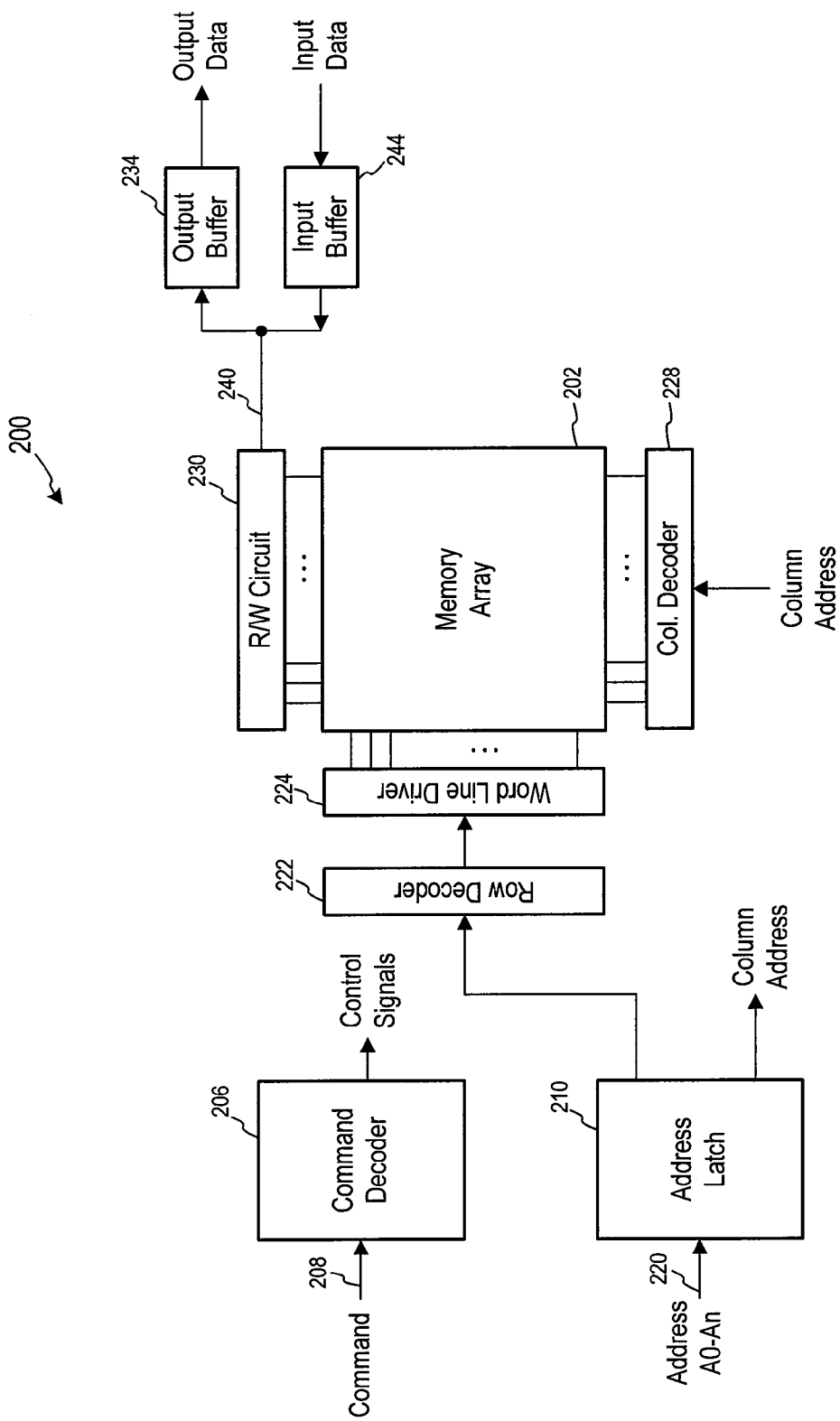
FIG. 7 is a block diagram of an embodiment of a memory system using a signaling system a shown in FIG. 1 or according to some other embodiment.

FIG. 7 is a block diagram of an embodiment of a memory system 200 using a signaling system embodiment as shown in FIG. 1 or according to some other embodiment. The memory system 200 may include an array 202 of memory cells, which may be, for example, DRAM memory cells, SRAM memory cells, flash memory cells, or some other types of memory cells. The memory system 200 may include a command decoder 206 that receives memory commands through a command bus 208 and generates corresponding control signals within the memory system 200 to carry out various memory operations. Row and column address signals may be applied to the memory system 200 through an address bus 220 and provided to an address latch 210. The address latch 210 may then output a separate column address and a separate row address.

The row and column addresses may be provided by the address latch 210 to a row address decoder 222 and a column address decoder 228, respectively. The column address decoder 228 may select bit lines extending through the array 202 corresponding to respective column addresses. The row address decoder 222 may be connected to word line driver 224 that activates respective rows of memory cells in the array 202 corresponding to received row addresses. The selected data line (e.g., a bit line or bit lines) corresponding to a received column address may be coupled to a read/write circuit 230 to provide read data to a data output buffer 234 via an input-output data bus 240. Write data may be applied to the memory array 202 through a data input buffer 244 and the memory array read/write circuitry 230. The command decoder 206 may respond to memory commands applied to the command bus 208 to perform various operations in the memory array 202. In particular, the command decoder 206 may be used to generate internal control signals to read data from and write data to the memory array 202.

Signaling systems according to various embodiments may be included in the memory system 200. In some embodiments of the memory system 200, signaling system may be configured to drive internal or on-chip signals from one internal component to another, for example, driving the internal control signals from the command decoder 206 to other internal components of the memory system 200. In other examples, an embodiment of a signaling system may couple internal address signals from the address decoders 222, 228, and couple internal data signals over the input-output bus 240. In other embodiments of the memory system 200, signaling system embodiments are configured to couple data signals applied to the memory system 200. For example, the input buffer 234 may include a preamplifier and receiver according to various embodiments to receive externally applied data signals before coupling the data signals to the read/write circuit 230. Signaling system according to various embodiments may also be utilized in applications other than memory systems.

Although the present invention has been described with reference to the disclosed embodiments, persons skilled in the art will recognize that changes may be made in form and detail without departing from the invention. Such modifications are well within the skill of those ordinarily skilled in the art. Accordingly, the invention is not limited except as by the appended claims.

I claim:

1. A signaling system, comprising:
   a signal path;
   a transmitter configured to receive a first digital signal and provide to the signal path at an output node a transmitted signal corresponding to the digital signal; and
   a receiver system, comprising:
      a preamplifier coupled to receive the transmitted signal from the signal path, the preamplifier being configured to provide an amplified signal corresponding to the transmitted signal received by the preamplifier, the preamplifier comprising a common-gate amplifying transistor; and
      a receiver coupled to receive the amplified signal from the preamplifier, the receiver being configured to provide a second digital signal corresponding to the amplified signal received by the receiver.

2. The signaling system of claim 1 wherein the signal path comprises a signal line that is unterminated by any impedance matching device.

3. The signaling system of claim 1 wherein the signal path comprises a through silicon via.

4. The signaling system of claim 1 wherein the preamplifier further comprises:
   a load impedance coupled between a drain of the common-gate amplifying transistor and a first supply voltage node;
   a bleeder impedance coupled between a source of the common-gate amplifying transistor and a second supply voltage node; and
   wherein a gate of the common-gate amplifying transistor is configured to be coupled to a bias voltage.

5. The signaling system of claim 4 wherein the load impedance comprises a resistance.

6. The signaling system of claim 4 wherein the load impedance comprises a second transistor having a gate, a source and a drain, the drain being coupled to the first supply voltage node, the source being coupled to the drain of the common-gate amplifying transistor, and the gate being configured to be coupled to another bias voltage.

7. The signaling system of claim 4 wherein the bleeder impedance comprises a resistor coupled between the source of the common-gate amplifying transistor and the second supply voltage node.

8. The signaling system of claim 4 wherein the bleeder impedance comprises a second transistor having a gate, a source and a drain, the source being coupled to the second supply voltage node, the drain being coupled to the source of the common-gate amplifying transistor, and the gate being configured to be coupled to receive another bias voltage.

9. The signaling system of claim 4 further comprising a bias voltage source configured to provide the bias voltage, wherein the bias voltage source comprises:
- a second transistor having a gate, a source and a drain, the source being coupled to the second supply voltage node and the drain being coupled to an output voltage node;
- a second load impedance coupled between the drain of the second transistor and the first supply voltage node;
- a second bleeder impedance coupled between the source of the second transistor and the second supply voltage node; and
- a differential amplifier having a first input node coupled to the output voltage node, a second input node coupled to receive a reference voltage, and an output node coupled to the gate of the second transistor, the differential amplifier being configured to generate the bias voltage with a magnitude corresponding to a difference between voltages at the first and second input nodes.

10. The signaling system of claim 4 wherein the common-gate amplifying transistor comprises an NMOS transistor.

11. The signaling system of claim 1 wherein the receiver comprises:
- a differential amplifier having a first input node coupled to receive the amplified signal from the preamplifier, and a second input node coupled to receive a reference voltage, the differential amplifier being configured to provide the second digital signal at an output node with a magnitude corresponding to a difference between voltages at the first and second input nodes.

12. The signaling system of claim 11 further comprising a reference voltage source configured to provide the reference voltage, wherein the reference voltage source comprises:
- a transistor having a gate configured to receive a bias voltage, a source and a drain, the drain being coupled to a reference voltage output node;
- a load impedance coupled between the drain of the transistor and a first supply voltage node; and
- a bleeder impedance coupled between the source of the transistor and a second supply voltage node.

13. The signaling system of claim 12, further comprising a low-pass filter, the low-pass filter being configured to couple the bias voltage to the gate of the transistor.

14. The signaling system of claim 1 wherein the transmitter is configured to provide the transmitted signal with an amplitude of less than about 50 millivolts.

15. The signaling system of claim 1 wherein the transmitter comprises:
- a first transistor having a gate and a drain and a source coupled between a first supply voltage node and a first circuit node;
- a second transistor having a drain and a source coupled between the first circuit node and the output node of the transmitter, the second transistor further having a gate coupled to receive a first signal derived from the first digital signal;
- a third transistor having a drain and a source coupled between the output node of the transmitter and a second supply voltage node, the third transistor further having a gate coupled to receive the first digital signal; and
- a voltage comparator having a first input coupled to the output node of the transmitter, a second input configured to receive a reference voltage, and an output node coupled to the gate of the first transistor, the voltage comparator being configured to control conductivity of the first transistor in response to the voltage of the output node relative to the reference voltage.

16. The signaling system of claim 1 wherein the preamplifier is configured to have a gain that is greater than unity so that the preamplifier is configured to provide an amplified signal having an amplitude that is greater than the transmitted signal received by the preamplifier.

17. A memory device, comprising:
- an array of memory cells;
- at least one transmitter configured to receive a first digital signal and to provide to a signal path a transmitted signal corresponding to the digital signal; and
- at least one receiver system, each receiver system comprising:
  - a preamplifier coupled to receive the transmitted signal from the signal path, the preamplifier being configured to provide an amplified signal corresponding to the transmitted signal received by the preamplifier, the preamplifier comprising a common-gate amplifying transistor; and
  - a receiver coupled to receive the amplified signal from the preamplifier, the receiver being configured to provide a second digital signal corresponding to the amplified signal received by the receiver.

18. The memory device of claim 17 wherein the preamplifier further comprises:
- a load impedance coupled between a drain of the common-gate amplifying transistor and a first supply voltage node;
- a bleeder impedance coupled between a source of the common-gate amplifying transistor and a second supply voltage node; and
- wherein a gate of the common-gate amplifying transistor is configured to be coupled to a bias voltage.

19. A method, comprising:
- serializing parallel data to generate a digital signal having a first signal swing;
- receiving the digital signal;
- amplifying the digital signal to generate an amplified signal having a second signal swing, the second signal swing based, at least in part, on a bias voltage;
- bleeding current from an input node to a supply voltage node,
- wherein the bias voltage is based, at least in part, on a reference voltage.

20. The method of claim 19 wherein the act of amplifying the digital signal to generate an amplified signal comprises using a common-gate amplifying transistor to amplify the digital signal to generate the amplified signal.

21. The method of claim 19, wherein the first and second signal swings have a same amplitude.

* * * * *